United States Patent [19]

Traub

[11] Patent Number: 5,550,845

[45] Date of Patent: Aug. 27, 1996

[54] METHOD FOR DYNAMIC TESTING OF DIGITAL LOGIC CIRCUITS

[75] Inventor: Karl Traub, Olching, Germany

[73] Assignee: Siemens Aktiengesellschaft, Munich, Germany

[21] Appl. No.: 712,468

[22] Filed: Jun. 10, 1991

[30] Foreign Application Priority Data

Aug. 3, 1990 [DE] Germany .................... 40 24 736.8

[51] Int. Cl.⁶ ............................................. G06F 11/00
[52] U.S. Cl. ................................. 371/27; 371/25.1
[58] Field of Search ........................ 371/22.1, 2.1, 371/20.4, 22.4, 24, 25.1, 27

[56] References Cited

U.S. PATENT DOCUMENTS

| | | | |
|---|---|---|---|
| 4,791,357 | 12/1988 | Hyduke | 371/25.1 |
| 4,942,576 | 7/1990 | Busack et al. | 371/25.1 |

FOREIGN PATENT DOCUMENTS

| | | | |
|---|---|---|---|
| 0360999 | 4/1990 | European Pat. Off. | G01R 31/28 |

OTHER PUBLICATIONS

*Microprocessors and Programmed Logic,* Second Edition by Kenneth L. Short, ©1987 by Prentice-Hall Inc. pp. 20–23.

*Digital Logic and Computer Design* by M. Morris Mano ©1979 by Prentice-Hall Inc. pp. 65–68.

Antreich et al, "Zum dynamischen Testen Kombinztorischer Schaltungen" Frequenz, vol. 44, pp. 103–111.

Primary Examiner—Vincent P. Canney
Attorney, Agent, or Firm—Hill, Steadman & Simpson

[57] ABSTRACT

A method for dynamic testing of digital logic circuits includes the application of cyclically-occurring digital signals to the inputs of a logic circuit and identifying anticipated output values in comparison to the inputs. Blank or dummy cycles are introduced after a predetermined number of test cycles, the blank or dummy cycles having the character that modifications no longer appear at the input signals. The predetermined number of test cycles is greater than or equal to 2.

6 Claims, 1 Drawing Sheet

METHOD FOR DYNAMIC TESTING OF DIGITAL LOGIC CIRCUITS

BACKGROUND OF THE INVENTION

1. Field of the Invention

The present invention relates to a method for testing digital logic circuits, and in particular for the dynamic testing of digital logic circuits in which a digital logic circuit is supplied by cyclically-occurring digital signals having a predetermined chronological spacing and in which an anticipated value is identified in all cycles of the digital signals at the outputs of the logic circuit as predicted from input signals applied to the inputs of the logic circuit and in which blank or dummy cycles are introduced after a predetermined number of test cycles and which have the character that modifications of the input signals no longer appear.

2. Description of the Prior Art

There are two things to be understood herein with respect to the term "dynamic testing of logic circuits".

During the development of a digital logic circuit, the behavior of a circuit is investigated with the assistance of a logic simulator and is tested for coincidence with a reference behavior under real-time conditions.

During manufacture, for example as an integrated circuit, each unit is tested with an automatic testing unit in that its behavior is tested for coincidence with an error-free circuit. Here, also, it is desirable to have the test sequence performed on a real-time basis.

A bit pattern is applied to the circuit in both instances and the reaction of the outputs is observed.

The application of the bit pattern occurs in a step-by-step process in accordance with a defined chronological sequence that must correspond to the operating frequency of the circuit.

The testing of the circuit occurs in that the states measured at the outputs in each of the testing steps at a defined strobe time are compared to anticipated reference values.

When these test steps are extremely short, this corresponding to a high-operating frequency, then the problem arises that the reaction of the outputs to the input modifications no longer occurs within the test step, but at a later time. An unambiguous allocation of an input bit pattern to an output bit pattern is then no longer possible.

In the case of manufacture, the additional problem also arises that output signals must be transmitted from the unit under test to a receiver portion of the automatic testing unit and must be processed there. As already mentioned above, an unambiguous allocation of an input bit pattern to an output bit pattern is therefore made additionally more difficult. It must thereby be taken into consideration that the available technology makes pattern generators available that can supply a logic circuit with input signals into the GHz range. Processing signals up to approximately 100 MHz, however, presents extreme difficulties at the receiver side.

A shift of the strobe time is extremely problematical since, dependent on the operating parameters, the delay times fluctuate greatly (worst case/best case> 6) or, respectively, the outputs to be evaluated do not have the same delay compared to one another.

The problem has heretofore been resolved in the development of logic circuits such that the circuit developer has observed the outputs as a pulse diagram with the assistance of the logic simulator and has visually compared the same to anticipated values.

Given the occurrence of the above-described problems of a great chronological delay between inputs and outputs, the designer either had to mentally compensate for this delay or he only looked for the proper sequence of the pulses in the output signals.

Since such a test must be repeatedly implemented during the development of a logic circuit, a procedure is desirable which, after a one-time, careful check of the function, allows the identified result to be stored in a computer and allows further tests to be automatically implemented by the computer.

SUMMARY OF THE INVENTION

It is the object of the present invention, therefore, to provide a method in which it is assured that an unambiguous allocation of an input bit pattern and of an output bit pattern is assured in the development and in the manufacture of a digital logic circuit.

The above object is achieved, according to the present invention, in a method for the dynamic testing of digital logic circuits, in which a digital logic circuit is supplied with digital signals that occur cyclically in a given chronological spacing, and whereby an anticipated value, an output value, is identified in all cycles at the outputs of the logic circuit in comparison to its inputs, and the method is particularly characterized in that blank or dummy cycles are introduced after a prescribable number> two cycles (n), the blank or dummy cycles having the character that modifications no longer appear at the input signals.

According to a particular feature of the invention, the method is characterized in that the number of cycles of the unspread, original bit pattern is a prime number or satisfies the equation $$z = (n \times m) + 1,$$

wherein z is the number of test cycles of the original bit pattern, n is the number of interconnected cycles and m is a whole number.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
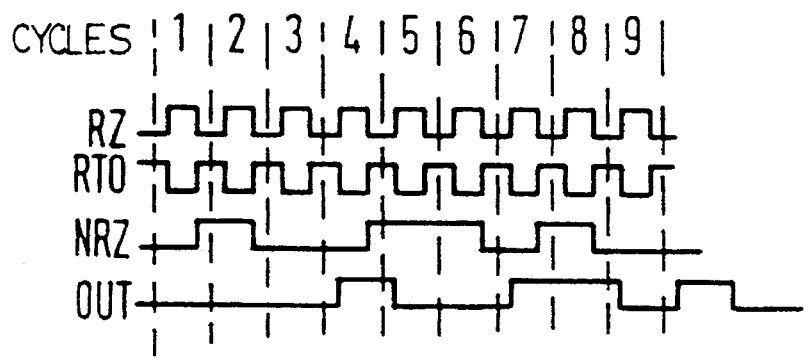
FIG. 1 is a graphic illustration of an original bit pattern.

FIG. 1 illustrates an original bit pattern used in a testing process. For testing a digital logic circuit, therefore, digital signals are supplied that appear in a cycle-like manner in a prescribed chronological spacing. The given spacing is illustrated for all lines of FIG. 1 in the example thereof for nine cycles.

FIG. 1, so to speak, also shows a circuit property of the logic circuit to be developed or to be tested. The behavior RZ which, as known, is referred to as "return to zero" is shown in the first line. The second line illustrates the behavior RTO, as known, denotes "return to one". The third line shows the behavior NRZ that refers to "non-return to zero" in the known technical language. And, finally, the fourth line shows the behavior OUT which, as known, denotes "output". As known, a logic circuit has many outputs.

Figure 2:
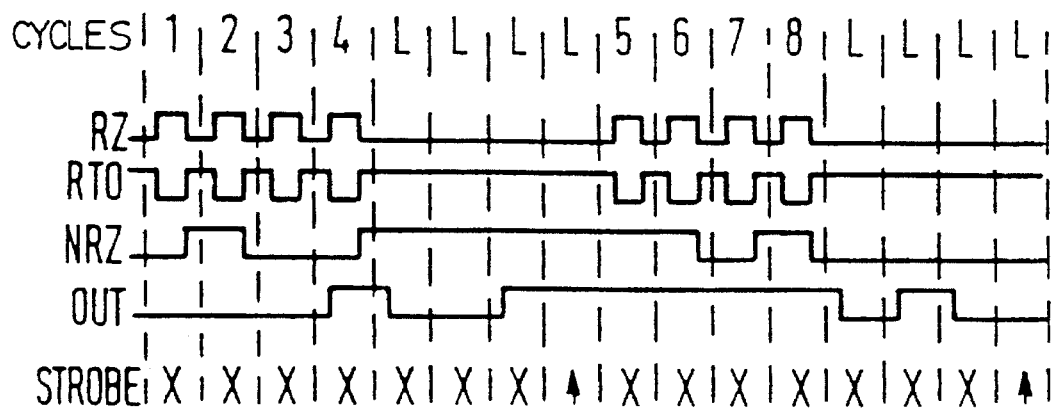
FIG. 2 is a graphic illustration of a bit pattern having n= 4 test cycles that is "spread" by the insertion of blank or dummy cycles.

Identical reference characters are employed for identical functionings in the following figures. It may therefore be seen in FIG. 2 that blank or dummy cycles L are inserted at the correct location. As already mentioned above, a "spread" bit pattern has arisen in FIG. 2 by inserting the blank or dummy cycles L and the number n=4 is thereby selected for the example, wherein n is the number of interconnected cycles.

Figure 3:
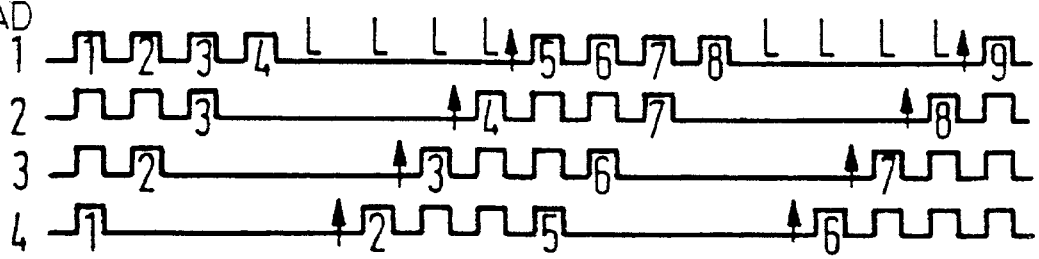
FIG. 3 is a graphic illustration of a strobing and evaluation process which becomes possible after each cycle on the basis of four-fold, n-time executions of the test pattern, and in which only the RZ signal is illustrated.

FIG. 3 illustrates a number of passes. How a strobing, i.e. an evaluation after each cycle becomes possible on the basis of four-fold, i.e. n-time execution of the test pattern is illustrated only for the RZ signal in the lines 1, 2, 3 and 4.

The example of FIG. 1 illustrates that outputs "OUT" react to a modification of the inputs only after about three cycles.

By inserting blank or dummy cycles L into the input bit pattern, the circuit is given adequate time in order to respond. The outputs are evaluated only at the end of these blank or dummy cycles L. Thereafter, the bit pattern again continues with the normal repetition rate for a defined number of cycles (see FIGS. 1 and 2). In the blank or dummy cycles L, RZ signals are set to zero, RTO signals are set to one and the state of NRZ signals is accepted from the last "true" cycle. After the conclusion of the simulation, all outputs are set to "X" (masked) with the exception of the last blank or dummy cycle that is introduced, as indicated by an upwardly-pointing arrow. The outputs set to "X" are not evaluated.

Since an evaluation of the outputs in the illustrated example occurs only after every fourth cycle, it must be seen to in the other three passes of the overall bit pattern that the outputs are also strobed in the remaining cycles (see FIG. 3). Just how many test cycles must be successively sequenced in real-time order, in order to time-critically simulate all paths of a circuit depends on the structure of the circuit. Given only one clock frequency, two cycles are adequate for this purpose.

In the above example having four successive cycles, a clock divided by two in the circuit and the circuit potion operated therewith could likewise be tested in real time since with four clock pulses, two clock pulses are always generated at half the frequency, these likewise having their real-time spacing.

Given higher divisions, correspondingly more input clock pulses must be applied in a real-time operation.

Given extremely high division ratios, however, a time problem would probably no longer occur insofar as synchronous circuits are involved.

The number of passes of the overall bit pattern required and, therefore, the time for the simulation also rise together with the number of the n interconnected cycles.

The following consideration holds true for the execution of the bit pattern spread and for masking of the outputs.

When the number of cycles z is dimensioned according to the following rule, then the processing of the bit pattern is particularly simple.

$$z=(n \times m)+1,$$

where z is the number of cycles of the original bit pattern, n is the number of the interconnected cycles, m is a whole number or z is a prime number.

The original bit pattern is first concatenated n times, i.e. is applied as a series of n executions.

What is achieved, given observation of the rule for the number z, is that the cycles to be strobed come to lie at a different location in each of the n sections due to regular insertion of the desired number of blank or dummy cycles across the entire bit pattern. This reasonably occurs with a suitable calculating program.

After the conclusion of the simulation, the result is again processed with a program in that the outputs of all cycles are mashed except for the last within an inserted group of blank or dummy cycles. Since the blank or dummy cycles are distributed over the entire bit pattern in a fixed grid, this masking can also be very simply implemented.

The present method can be applied both when simulating a circuit and when testing a circuit during the manufacturing process.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for dynamic testing of logic circuits, comprising the steps of:
    (a) applying cyclically-occurring digital signals having a predetermined chronological spacing to inputs of the logic circuit;
    (b) identifying anticipated values in all cycles at outputs of the logic circuit with respect to its inputs; and
    (c) after at least two test cycles, introducing dummy cycles to provide a spread of the digital signals such that modifications no longer appear at the inputs to the logical circuits during the spread.

2. The method according to claim 1, wherein the digital signals have bit patterns and wherein the step (a) of applying cyclically-occurring digital signals is further defined as:
    (a1) producing a number of test cycles z of an unspread, original bit pattern, where z is a prime number.

3. The method according to claim 1, wherein the step (a) of applying cyclically-occurring digital signals is further defined as:

producing a number of test cycles z of an unspread, original bit pattern of the digital signals, where z satisfies the relationship $$z=(n \times m)+1,$$

where z is the number of test cycles, n is the number of interconnected cycles, and m is a whole number.

4. A method for dynamic testing of logic circuits, comprising the steps of:

supplying at least one digital signal having a bit pattern that occurs in cycles to a logic circuit;

inserting dummy cycles into said bit pattern after at least two cycles of the bit pattern to provide a predetermined number of interconnected cycles of the dummy cycles; and evaluating outputs of the logic circuit only at the end of the interconnected cycles of dummy cycles.

5. The method according to claim 4, wherein a number z of the cycles of said bit pattern is determined according to;

$$z = (n \times m) + 1,$$

where n is the number of interconnected cycles, and m is a whole number.

6. The method according to claim 4, wherein the number z is a prime number.

* * * * *